(12) United States Patent
Tazawa et al.

(10) Patent No.: US 10,381,804 B2
(45) Date of Patent: Aug. 13, 2019

(54) VERTICAL CAVITY LIGHT EMITTING ELEMENT

(71) Applicant: STANLEY ELECTRIC CO., LTD., Meguro-ku, Tokyo (JP)

(72) Inventors: Komei Tazawa, Kawasaki (JP); Ji-Hao Liang, Tachikawa (JP); Seiichiro Kobayashi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/886,113

(22) Filed: Feb. 1, 2018

(65) Prior Publication Data

US 2018/0226771 A1 Aug. 9, 2018

(30) Foreign Application Priority Data

Feb. 8, 2017 (JP) .................................. 2017-021280

(51) Int. Cl.
*H01S 5/183* (2006.01)
*H01S 5/22* (2006.01)
(Continued)

(52) U.S. Cl.
CPC .......... *H01S 5/2205* (2013.01); *H01S 5/0425* (2013.01); *H01S 5/183* (2013.01);
(Continued)

(58) Field of Classification Search
CPC .... H01S 5/2205; H01S 5/34333; H01S 5/183; H01S 5/34346; H01S 5/0425; H01S 5/3407
See application file for complete search history.

(56) References Cited

U.S. PATENT DOCUMENTS 6,266,357 B1 * 7/2001 Feld ....................... B82Y 20/00
372/46.01
9,160,138 B2 10/2015 Hoshino et al.
(Continued)

FOREIGN PATENT DOCUMENTS

EP 2835884 A2 2/2015
JP 5707742 B2 4/2015

OTHER PUBLICATIONS

Extended European Search Report (EESR) dated Jun. 22, 2018 issued in counterpart European Application No. 18155124.3.
(Continued)

*Primary Examiner* — Xinning(Tom) Niu
(74) *Attorney, Agent, or Firm* — Holtz, Holtz & Volek PC

(57) ABSTRACT

A vertical-cavity light-emitting element includes: a first reflector; a semiconductor structure layer including a first semiconductor layer, an active layer, a second semiconductor layer, and a third semiconductor layer that are sequentially provided on the first reflector; a transparent electrode on the third semiconductor layer; and a second reflector on the transparent electrode and interposes the structure layer with the first reflector. The third semiconductor layer has a mesa structure to protrude on the second semiconductor layer and be covered by the transparent electrode. The light emitting element further includes a current confining layer including: an insulating film provided in the second semiconductor layer to surround the mesa structure and be in contact with the transparent electrode, the insulating film being an oxide of the second semiconductor layer; and an insulating layer on the insulating film to surround the mesa structure and define a through opening.

7 Claims, 6 Drawing Sheets

(51) Int. Cl.
*H01S 5/042* (2006.01)
*H01S 5/343* (2006.01)
*H01S 5/34* (2006.01)
*H01S 5/20* (2006.01)
*H01L 33/10* (2010.01)

(52) U.S. Cl.
CPC ...... *H01S 5/18311* (2013.01); *H01S 5/18333* (2013.01); *H01S 5/18352* (2013.01); *H01S 5/2013* (2013.01); *H01S 5/3407* (2013.01); *H01S 5/34333* (2013.01); *H01S 5/34346* (2013.01); *H01L 33/105* (2013.01); *H01S 5/18341* (2013.01); *H01S 5/18369* (2013.01)

(56) References Cited

U.S. PATENT DOCUMENTS

| | | |
|---|---|---|
| 9,407,067 B2 | 8/2016 | Hamaguchi et al. |
| 9,893,492 B2 | 2/2018 | Hamaguchi et al. |
| 2001/0030317 A1* | 10/2001 | Lee ........................ B82Y 20/00 257/13 |
| 2005/0265412 A1* | 12/2005 | Ueki .................. H01S 5/18377 372/43.01 |
| 2010/0230690 A1* | 9/2010 | Kyono .................. B82Y 20/00 257/94 |
| 2015/0043601 A1 | 2/2015 | Hamaguchi et al. |
| 2015/0146749 A1 | 5/2015 | Hoshino et al. |
| 2016/0308332 A1 | 10/2016 | Hamaguchi et al. |
| 2018/0145483 A1 | 5/2018 | Hamaguchi et al. |

OTHER PUBLICATIONS

Feezell, "Status and future of GaN-based vertical-cavity surface-emitting lasers", Proceedings of SPIE, vol. 9363, Mar. 2015.

* cited by examiner

VERTICAL CAVITY LIGHT EMITTING ELEMENT

BACKGROUND OF THE INVENTION

1. Field of the Invention

The present invention relates to a vertical cavity light emitting element such as a vertical cavity surface emitting laser (VCSEL).

2. Description of the Related Art

A vertical cavity surface emitting laser is a semiconductor laser having a structure to cause light to resonate vertically to a substrate surface and then to cause the light to emit in a direction vertical to the substrate surface. Patent Literature 1 (Japanese Patent No. 5707742), for example, discloses a vertical cavity surface emitting laser in which a semiconductor structure layer SMC (including an n-type semiconductor layer, an active layer, and a p-type semiconductor layer) is interposed between a first reflector 13 provided on a substrate 11 and a second reflector 25, and an insulating layer 21 having an opening OP1 as a current confining structure and a light-transmissive electrode 23 are disposed between the semiconductor structure layer SMC and the second reflector 25 as shown in FIG. 7. The reflectors opposed to each other with an opening of the light-transmissive electrode and the active layer interposed therebetween constitute a cavity.

SUMMARY OF THE INVENTION

In the conventional vertical cavity surface emitting laser, however, current confined by the current confining structure of the emission opening OP1 upon the application of current between opposing electrodes 29P and 29N has increased lateral current spreading before reaching the active layer and thus spreads from the current confining part (opening) (see triangular arrows). Such correct becomes reactive current. In a microarray device, in particular, the proportion of the reactive current is significantly increased, thus leading to increased threshold current and deteriorated emission efficiency. Furthermore, the ITO light-transmissive electrode in the vicinity of the edge of the opening OP1 becomes a path of the current diffusing to the outer side of the opening. Consequently, such an electrode portion is more likely to have increased current density, thus leading to the deterioration of the electrode. Accordingly, the conventional vertical cavity surface emitting laser needs a method for suppressing current spreading in the active layer.

The present invention has been made in view of the aforementioned problems. It is an object of the present invention to provide a vertical cavity light emitting element capable of suppressing current spreading in ac active layer.

According to one aspect of the present invention, a vertical cavity light emitting element includes: a first reflector;
a semiconductor structure layer including a first semiconductor layer of a first conductivity type, an active layer, a second semiconductor layer of a second conductivity type opposite to the first conductivity type, and a third semiconductor layer of the second conductivity type that are sequentially provided on the first reflector;
a transparent electrode provided on the third semiconductor layer; and
a second reflector provided on the transparent electrode.

In this vertical cavity light emitting element,
the first reflector and the second reflector interpose the semiconductor structure layer therebetween, and
the third semiconductor layer is a mesa structure provided so as to protrude on the second semiconductor layer and be covered by the transparent electrode.

The vertical cavity light emitting element further includes a current confining layer including: an insulating film that is provided on the second semiconductor layer so as to surround the mesa structure and be in contact with the transparent electrode and that is formed from an oxide derived from a component of the second semiconductor layer; and an insulating layer provided on the insulating film so as to surround the mesa structure and define a through opening.

DETAILED DESCRIPTION OF THE INVENTION

Figure 1:
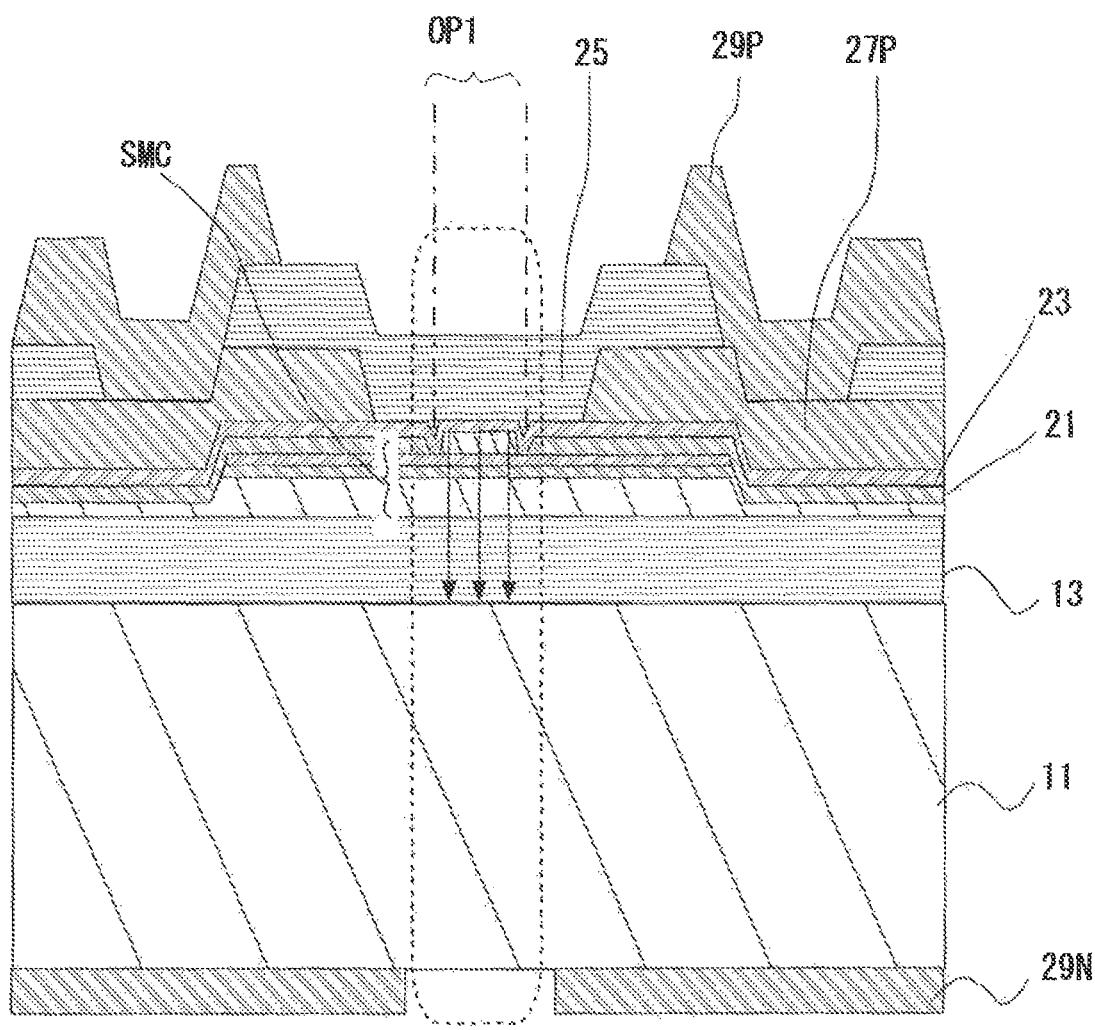
FIG. 1 is a general cross-sectional view schematically illustrating part of a vertical cavity surface emitting laser according to an embodiment of the present invention.

A vertical cavity surface emitting laser (hereinafter also referred to simply as a surface emitting laser) will now be described as an example of a vertical cavity light emitting element of the present invention with reference to the drawings. Substantially the same or equivalent elements will be denoted by the same reference numerals in the following description and the accompanying drawings.

Embodiments

Figure 2:
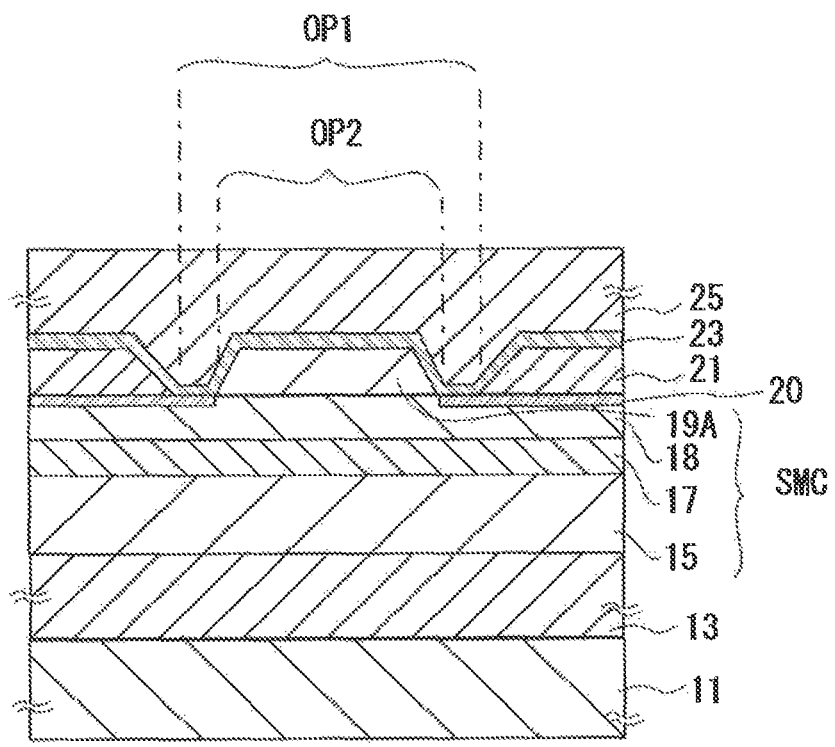
FIG. 2 is a general enlarged view illustrating a cross-sectional structure of a dotted line region in FIG. 1.

FIG. 1 is a general cross-sectional view illustrating part of a surface emitting laser according to an embodiment of the present invention. FIG. 2 is a general enlarged view illustrating a cross-sectional structure of a dotted line region in FIG. 1.

As shown in FIGS. 1 and 2, a surface emitting laser 10 has a layered structure comprising a first reflector 13 having a conductive property, an n-type semiconductor layer 15 (first semiconductor layer) active layer 17 including a quantum well layer (for example, a plurality of pairs of InGaN/GaN), an electron block layer 18 (second semiconductor layer), and a p-type semiconductor mesa structure 19A (third semiconductor layer) that are sequentially provided on a conductive substrate 11 comprising GaN (gallium nitride), for example. A semiconductor structure layer SMC comprising the first reflector 13, and the n-type semiconductor layer 15, the active layer 17, the electron block layer 18, and the p-type semiconductor mesa structure 19A in the layered structure is formed from GaN-based semiconductors by the epitaxial growth method. A material having larger bandgap energy than GaN, for example, AlGaN-based semiconductor layer such as AlGaN may be employed in the electron block layer 18.

The p-type semiconductor mesa structure 19A is a p-type semiconductor mesa structure provided so as to protrude on the electron block layer 18.

The surface emitting laser 10 further includes an insulating film 20 provided on the electron block layer 18 so as to surround the p-type semiconductor mesa structure 19A and define an opening edge (or opening) OP2 while being in close contact with the p-type semiconductor mesa structure 19A.

The surface emitting laser 10 further includes an insulating layer 21 provided on the insulating film 20 so as to surround the p-type semiconductor mesa structure 19A and define a through opening OP1.

The surface emitting laser 10 further includes a conductive transparent electrode 23 and a second reflector 25 sequentially provided on the p-type semiconductor mesa structure 19A of the semiconductor structure layer SMC, the insulating film 20, and the insulating layer 21.

[P-Type Semiconductor Mesa Structure]

FIGS. 3A to 3D are general partial cross-sectional views each for illustrating part of a configuration of the vertical cavity surface emitting laser during the production thereof according to the embodiment of the present invention. These figures omit the substrate 11 and the first reflector 13, and illustrate steps up to the formation of the insulating layer 21 on the fabricated semiconductor structure layer SMC.

Figure 3A:
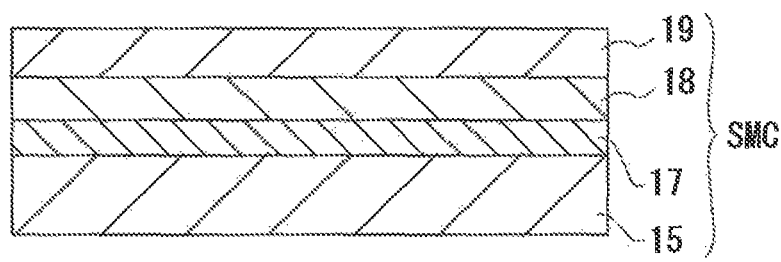
FIGS. 3A to 3D are general partial cross-sectional views each for illustrating part of a configuration of the vertical cavity surface emitting laser during the production thereof according to the embodiment of the present invention.

As shown in FIG. 3A, the formation of the semiconductor structure layer SMC up to a p-type semiconductor layer 19 is performed by the metal organic chemical vapor deposition (MOCVD), for example.

Figure 3B:
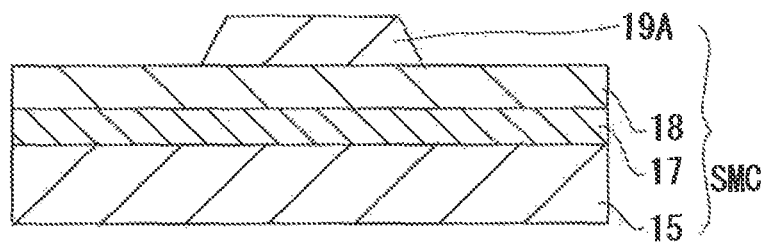

As shown in FIG. 3B, the p-type semiconductor layer 19 is selectively removed by dry etching to form the p-type semiconductor mesa structure 19A. Here, a side wall of the p-type semiconductor mesa structure 19A may have a tapered cross-sectional shape so as to have a gradually-decreasing width (i.e. gradually-decreasing thickness). The purpose of this is to prevent the disconnection of the transparent electrode to be deposited in a subsequent step.

Figure 3C:
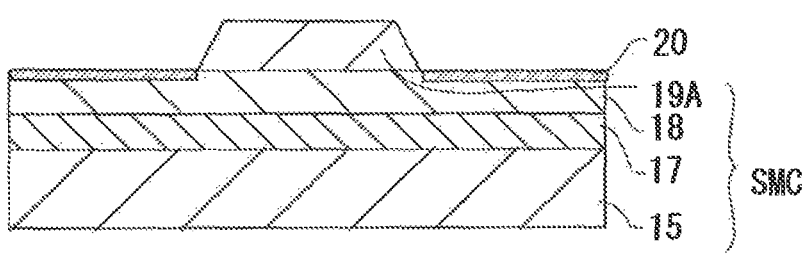

Thereafter, as shown in FIG. 3C, an annealing step (for example, in an $O_2$ atmosphere at 450° C.) is performed to oxidize an exposed portion of the electron block layer 18 such as AlGaN (the surrounding area of the p-type semiconductor mesa structure 19A). Consequently, the insulating film 20 ($Al_xO_yGa_zN_{1-z-y-z}$), which is an Al oxide film, is formed as a current confining layer. The insulating film 20 is an insulating film comprising an oxide derived from an Al component of the AlGaN electron block layer 18. In other words, the insulating film 20 is an oxidized surface layer of the electron block layer 18.

Figure 3D:
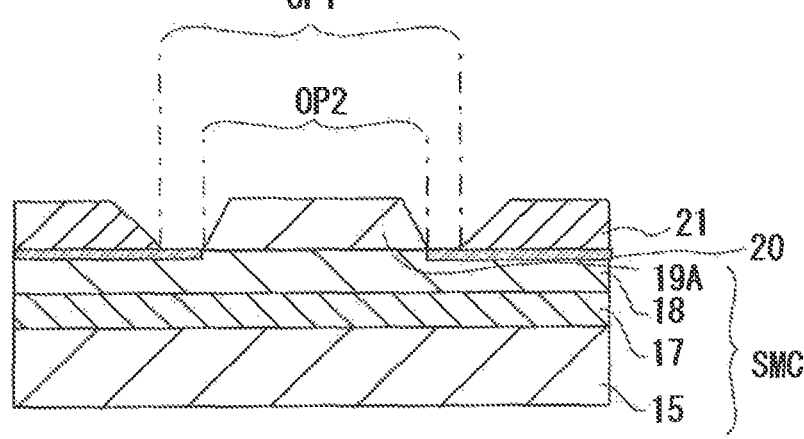

Thereafter, $SiO_2$ of the insulating layer 21 is formed uniformly on the insulating film 20 (Al oxide film). A predetermined resist pattern is then provided on the insulating layer 21 excluding the region of the mesa structure 19A and part of the surrounding area thereof. The insulating layer 21 on the mesa structure 19A and the part of the surrounding area thereof is then removed. Consequently, the through opening OP1 surrounding the p-type semiconductor mesa structure 19A is formed on the insulating film 20 as shown in FIG. 3D.

The steps described above can prevent electrostatic breakdown in the electron block layer 18 since the insulating film 20 (Al oxide film) serves as a current confining layer (opening edge OP2) even when the diameter of the p-type semiconductor mesa structure 19A is smaller than the diameter of the through opening OP1 of the insulating layer 21. This structure can produce a VCSEL element having high productivity while suppressing current spreading in the electron block layer 18.

Figure 4:
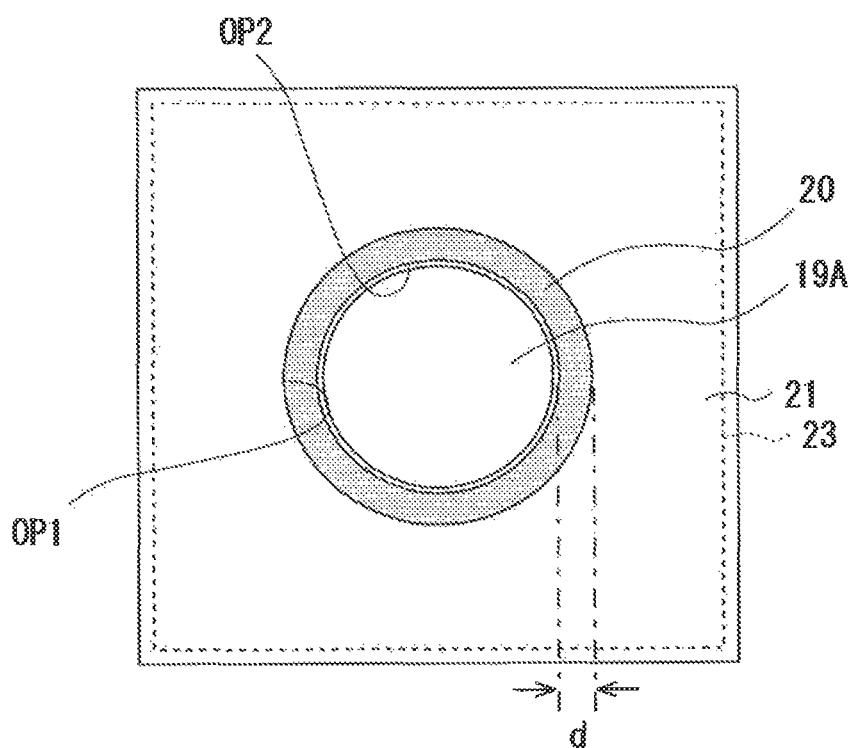
FIG. 4 is a general top view for illustrating a configuration of an opening edge of an insulating film within a through opening of an insulating layer of the vertical cavity surface emitting laser according to the embodiment of the present invention.

FIG. 4 is a general top transparent view, as viewed from the second reflector 25 side (the second reflector 25 is not shown in this figure), for explaining the opening edge OP2 of the insulating film 20 within the through opening OP1 of the insulating layer 21 in the surface emitting laser 10. The p-type semiconductor mesa structure 19A has a truncated cone shape. A contact portion of the transparent electrode 23 and the insulating film 20 has an annular shape.

As shown in FIG. 4, the opening edge OP2 preferably has a circular shape with a diameter of 1 to 15 μm, preferably 3 to 10 μm, in order to obtain a Gaussian beam by making distances to the beam center equidistant. This allows for uniform current injection into the active layer 17 and uniform confinement of an optical beam. The shape of the opening edge OP2 may be a shape approximate to a circle such as an ellipse other than a circle, or a polygon.

As shown in FIG. 4, an alignment margin between the mesa structure 19A and the edge of the opening OP1 of the insulating layer 21 can be maintained by a width d therebetween. In the case of d=1 to 2 μm, for example, setting an emission aperture (the diameter of the p-type semiconductor mesa structure 19A) to 8 μm allows the diameter of the through opening OP1 of the insulating layer 21 to be 10 to 12 μm. While current confinement can be achieved only by the insulating film 20 (Al oxide film), it is not easy to form the insulating film 20 (Al oxide film) in a stable manner over a large area due to its small thickness of about several nanometers. A two-layered current confinement structure having the $SiO_2$ insulating layer 21 (a thickness of about 100 nm) in addition to the insulating film 20 (Al oxide film) is more preferred since such a two-layered structure can prevent reduction in production yield.

The transparent electrode 23 is formed over the insulating film 20, the insulating layer 21, and the p-type semiconductor mesa structure 19A so as to cover the through opening OP1 of the insulating layer 21 and be in contact with the p-type semiconductor mesa structure 19A. The insulating film 20 blocks current injection into the electron block layer 15 on the outer side of the opening edge OP2 (boundary between the p-type semiconductor mesa structure 19A and the insulating film 20). On the inner side of the opening edge OP2, current is injected into the active layer 17 via the p-type semiconductor mesa structure 19A.

[Electron Block Layer]

Figure 5:
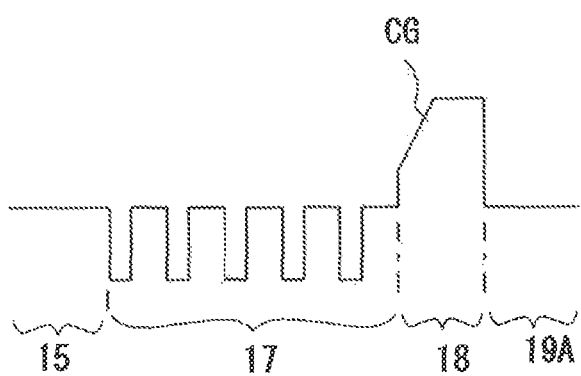
FIG. 5 is an energy band diagram of a conduction band in an MQW active layer, an electron block layer, and a p-type semiconductor mesa structure in the vertical cavity surface emitting laser according to the embodiment of the present invention.

FIG. 5 is an energy band diagram of a conduction band in the MQW active layer 17, the electron block layer 18, and the p-type semiconductor mesa structure 19A in the vertical cavity surface emitting laser of the present embodiment.

In order to suppress the overflow of electrons from the active layer 17 to the p-type semiconductor mesa structure 19A, the Al composition of the electron block layer 18 is preferably increased to increase the bandgap energy. Accordingly, the electron block layer 18 has an Al composition gradient CG such that the Al composition increases toward the p-type semiconductor mesa structure 19A from the active layer 17 side as shown in FIG. 5. This is because the portion of the electron block layer 18 adjacent or closer to p-GaN is preferred to have a higher Al composition when the insulating film 20 (Al oxide film) is formed.

Figure 6:
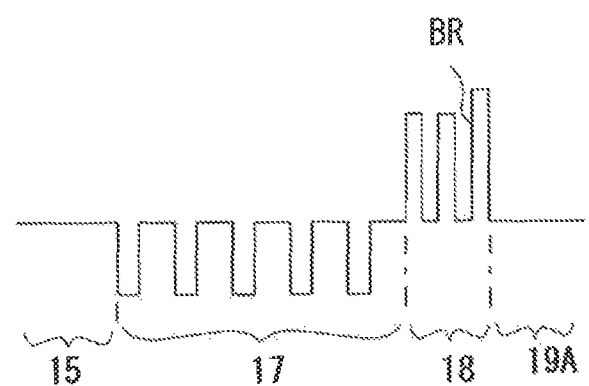
FIG. 6 is an energy band diagram of a conduction band in an MQW active layer, an electron block layer, and a p-type semiconductor mesa structure in a modification of the vertical cavity surface emitting laser according to the embodiment of the present invention.
Figure 7:
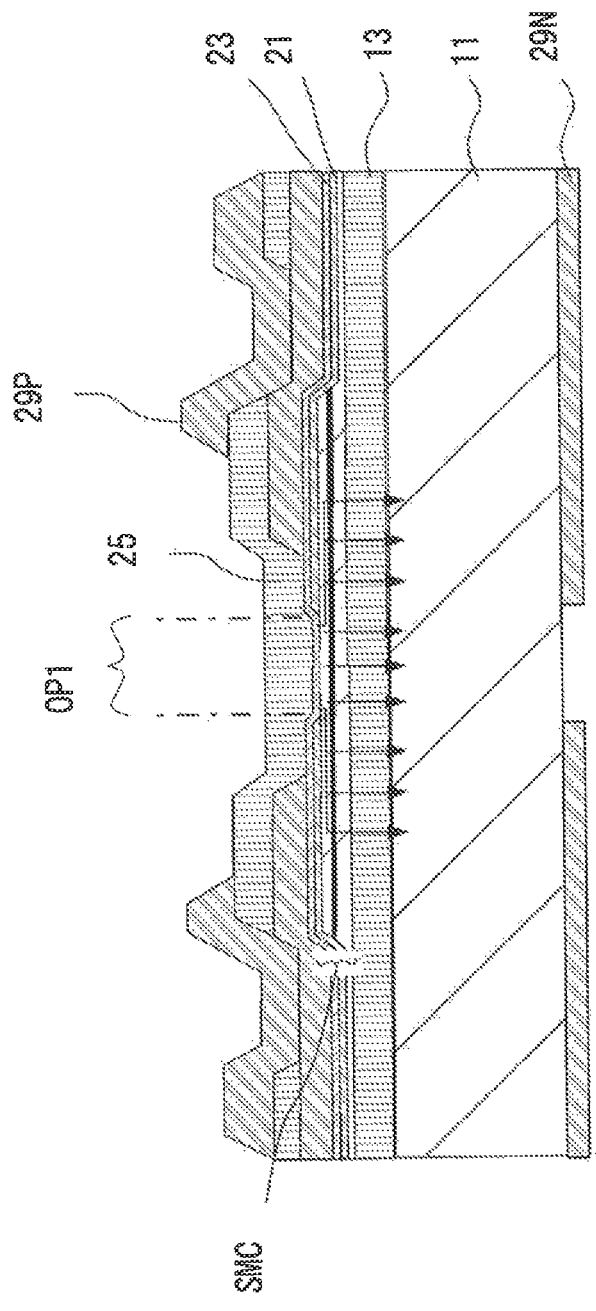
FIG. 7 is a general partial cross-sectional view of a conventional vertical cavity surface emitting laser.

FIG. 6 is an energy band diagram of a conduction panel in an MQW active layer 17, an electron block layer 18, and a p-type semiconductor mesa structure 19A according to a modification of the vertical cavity surface emitting laser of the present embodiment.

The efficiency of electron injection can be improved also by employing a multiquantum barrier (MQB) in the electron block layer 18. FIG. 6 is the energy band diagram of the conduction band in the vicinity of the electron block layer 18 using the MQB of AlGaN (a thickness of 4 nm)/GaN (a thickness of 4 nm) layers. This modification shows the MQB. Caution is required since excessively thin AlGaN fails to obtain a desired Al composition and thus the MQB no longer functions as the electron block layer 18. When the insulating film 20 (Al oxide film) is formed, the Al composition of the final layer (i.e. an AlGaN barrier BR adjacent or contacting to p-GaN) of the MQB is preferably increased as shown in FIG. 6. This is because the exposed electron block layer 18 (i.e. barrier BR) to p-GaN is preferred to have a higher Al composition when the insulating film 20 (Al oxide film) is formed.

[Other Elements]

As shown in FIG. 1, a P-electrode 27P for injecting current is provided so as to be electrically connected to the transparent electrode 23 in the surrounding area of the p-type semiconductor mesa structure 19A. A P-pad electrode 29P is provided to pass through the insulating second reflector 25 so that the P-pad electrode 29P is electrically connected to the P-electrode 27P in a surrounding area of the large mesa structure including the semiconductor structure layer SMC. Consequently, the transparent electrode 23 can be electrically connected to an external device via the P-electrode 27P.

As shown in FIG. 1, an N-electrode 29N is provided on a back surface of the substrate 11. Although not shown in the figure, the N-electrode 29N may be provided to pass through the first reflector 13 so that the N-electrode 29N is electrically connected to the n-type semiconductor layer 15.

The portion of the first reflector 13 and the second reflector 25 opposed to each other with the opening edge OP2 and the active layer 17 interposed therebetween constitutes a cavity. The opening edge OP2 provided immediately under the transparent electrode 23 in the cavity corresponds to a laser beam window. A laser beam is emitted from either the first reflector 13 or the second reflector 25.

In the present embodiment, the first reflector 13 is formed as a distributed Bragg reflector (DBR) comprising GaN-based semiconductor multi-layer films. The first reflector 13 may be formed by layering 40 pairs of GaN/InAlN, for example. The second reflector 25 is formed as a distributed Bragg reflector comprising dielectric multi-layer films. The second reflector 25 and the first reflector 13 interpose the semiconductor structure layer SMC therebetween and define a resonance structure. The first reflector 13 and the second reflector 25 are each configured to obtain a desired conductive property, insulation property, and reflectivity by appropriately adjusting the number of multi-layer film pairs (two thin films having different refractive indexes are alternately layered a plurality of times), materials used, a film thickness, and the like. In the case of an insulating reflector, a metal oxide, a semimetal oxide, or a nitride such as AlN, AlGaN, GaN, BN, or SiN, for example, may be used as a material for the dielectric thin film. An insulating reflector can be obtained by cyclically layering pairs of at least two dielectric thin films having different refractive indexes, for example, pairs of $SiO_2/Nb_2O_5$, $SiO_2/ZrO_2$, $SiO_2/AlN$, or $Al_2O_3/Nb_2O_5$.

The semiconductor structure layer SMC includes the n-type semiconductor layer 15, the active layer 17 including the quantum well layer, and the p-type semiconductor mesa structure 19A that are sequentially provided on the first reflector 13. In the present embodiment, the first reflector 13 and each layer in the semiconductor structure layer SMC each have a composition of $Al_xIn_yGa_{1-x-y}N$ ($0 \leq z \leq 1$, $0 \leq y \leq 1$, $0 \leq x+y \leq 1$). The first reflector 13 has, for example, a structure in which pairs of a low refractive index semiconductor layer having a composition of AlInN and a nigh refractive index semiconductor layer having a composition of GaN are alternately layered. In the present embodiment, the active layer 17 has a quantum well structure in which pairs of a well layer (not shown) having a composition of InGaN and a barrier layer (not shown) having a composition of GaN are alternately layered. The n-type semiconductor layer 15 has a composition of GaN and contains Si as an n-type impurity. The p-type semiconductor mesa structure 19A has a composition of GaN and contains a p-type impurity such as Mg. Thus, the n-type semiconductor layer 15 and the p-type semiconductor mesa structure 19A have conductivity types opposite to each other. The semiconductor structure layer SMC can be designed to have an emission wavelength of 400 to 450 nm.

The first reflector 13 is formed using the MOCVD, for example. Note that a buffer layer (not shown) may be formed between the substrate 11 and the first reflector 13.

Examples of the composition material of the insulating layer 21 may include oxides such as $SiO_2$, $Ga_2O_3$, $Al_2O_3$, and $ZrO_2$, and nitrides such as SiN, AlN, and AlGaN, $SiO_2$ is preferably used in the insulating layer 21. The thickness of the insulating layer 21 is 5 to 1,000 nm, and preferably 10 to 300 nm.

Examples of the light-transmissive composition material of the conductive transparent electrode 23 may include indium tin oxide (ITO), In-doped ZnO (IZO), Al-doped ZnO (AZO), Ga-doped ZnO (GZO), Sb-doped $SnO_2$ (ATO), F-doped $SnO_2$ (FTO) Nb-doped $TiO_2$ (NTO), and ZnO. ITO is preferably used in the transparent electrode 23. The thickness of the transparent electrode 23 is 3 to 100 nm, and preferably 20 nm or less. The transparent electrode 23 may be deposited by the electron beam evaporation method or sputtering.

According to the surface emitting laser of the present invention described above, threshold current can be reduced by the suppression of the lateral current spreading, and at the same time, the deterioration of the transparent electrode can be reduced by uniform current injection into the light emitting portion. In addition to the reduction in the threshold current (thus, power consumption) of the surface emitting laser itself, the current confining two-layered structure of the insulating film (Al oxide film) and the $SiO_2$ insulating layer can achieve effective current confinement, and improve the production yield of the surface emitting laser. In arrayed surface emitting lasers, in particular, the present invention is effective in reducing variations in threshold current among the light emitting parts of the plurality of surface emitting lasers. Such a surface emitting laser is useful in an automobile headlight or a projector.

While the semiconductor structure layer SMC comprises GaN (gallium nitride-based semiconductors in any of the embodiments of the present invention, the crystal system is not limited thereto. The above-described embodiments may be modified and combined as appropriate.

While the first reflector 13 is a semiconductor provided on the substrate 11 in the embodiments, the first reflector 13 is not limited thereto. The first reflector 13 may be provided on the surface of the substrate 11 opposite to the semiconductor structure layer SMC. In such a case, the first reflector 13 may be provided by dielectric thin film materials as with the second reflector. The first reflector 13 only needs to interpose the semiconductor structure layer SMC together with the second reflector 25 so as to define the resonance structure.

This application is based on a Japanese Patent Application No. 2017-021280 which is hereby incorporated by reference.

What is claimed is:

1. A vertical cavity light emitting element comprising:
   a first reflector;
   a first semiconductor layer of a first conductivity type formed on the first reflector;
   an active layer formed on the first semiconductor layer;
   a second semiconductor layer of a second conductivity type opposite to the first conductivity type formed on the active layer;
   a third semiconductor layer of the second conductivity type formed on the second semiconductor layer, the third semiconductor layer having a mesa structure as to protrude on the second semiconductor layer and partially cover the second semiconductor layer;
   an insulating film formed in the second semiconductor layer so as to surround the mesa structure of the third semiconductor layer, the insulating film being formed from an oxide of the second semiconductor layer;
   an insulating layer formed on the insulating film so as to surround the mesa structure of the third semiconductor layer and define an emission opening region in which the mesa structure of the third semiconductor layer is disposed;
   a transparent electrode formed on and covering the mesa structure of the third semiconductor layer, the insulating film, and the insulating layer, wherein a contact portion of the transparent electrode and the insulating film has an annular shape; and
   a second reflector provided on the transparent electrode.

2. The vertical cavity light emitting element according to claim 1, wherein the first semiconductor layer comprises an n-type GaN-based semiconductor, the second semiconductor layer comprises a p-type GaN-based semiconductor containing aluminum, and the third semiconductor layer comprises a p-type GaN-based semiconductor.

3. The vertical cavity light emitting element according to claim 2, wherein the second semiconductor layer comprises a multiquantum barrier including a barrier layer of a p-type GaN-based semiconductor containing aluminum and a well layer of a p-type GaN-based semiconductor.

4. The vertical cavity light emitting element according to claim 2, wherein the second semiconductor layer has a higher aluminum concentration in a portion closer to the third semiconductor layer than in a portion closer to the active layer.

5. The vertical cavity light emitting element according to claim 1, wherein the mesa structure of the third semiconductor layer has a truncated cone shape.

6. The vertical cavity light emitting element according to claim 5, wherein the mesa structure has a constant thickness except a tapered side surface, the tapered side surface having a continuously-decreasing thickness toward the insulating film.

7. The vertical cavity light emitting element according to claim 1, wherein the transparent electrode is directly in contact with both the insulating layer and the second reflector.

* * * * *